United States Patent
Lee et al.

(10) Patent No.: US 9,312,121 B1
(45) Date of Patent: Apr. 12, 2016

(54) METHOD FOR CLEANING CONTACT HOLE AND FORMING CONTACT PLUG THEREIN

(71) Applicant: UNITED MICROELECTRONICS CORPORATION, Hsinchu (TW)

(72) Inventors: Yi-Hui Lee, Taipei (TW); Tsung-Hung Chang, Linnei Township (TW); Ching-Wen Hung, Tainan (TW); Jia-Rong Wu, Kaohsiung (TW); Ching-Ling Lin, Kaohsiung (TW); Chih-Sen Huang, Tainan (TW); Yi-Wei Chen, Taichung (TW); Chia-Chang Hsu, Kaohsiung (TW); Shu-Min Huang, Tainan (TW); Hsin-Fu Huang, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/511,092

(22) Filed: Oct. 9, 2014

(51) Int. Cl.
*H01L 21/02* (2006.01)
*H01L 21/768* (2006.01)

(52) U.S. Cl.
CPC .... *H01L 21/02046* (2013.01); *H01L 21/76864* (2013.01); *H01L 21/76883* (2013.01)

(58) Field of Classification Search
CPC ............ H01L 27/14687; H01L 21/02063; H01L 21/76843; H01L 21/28518; H01L 21/76846; H01L 21/76814; H01L 21/0206; H01L 21/76874; H01L 21/2855; H01L 21/76802; H01L 21/76847; H01L 21/76856; H01L 21/768; H01L 21/76865; H01L 21/76883; H01L 21/324; H01L 23/53238; H01L 23/53295; H01L 21/02057; H01L 21/02337; H01L 21/67069; H01L 21/76801; H01L 21/76807; H01L 21/76864; H01L 2221/1036; H01L 23/53; C23C 16/42; C23C 18/1651; C23C 16/0227; C23C 16/45536
USPC .......................... 438/653, 637, 720, 424, 427
See application file for complete search history.

(56) References Cited

U.S. PATENT DOCUMENTS

| | | | | |
|---|---|---|---|---|
| 5,312,772 A | * | 5/1994 | Yokoyama | ........ H01L 21/28518 257/E21.165 |
| 6,054,768 A | * | 4/2000 | Givens | ................. H01L 23/485 257/618 |
| 6,107,192 A | * | 8/2000 | Subrahmanyan | ..... C23C 14/022 257/E21.17 |
| 7,622,386 B2 | | 11/2009 | Madan | |
| 8,563,424 B2 | | 10/2013 | Ganguli | |
| 2013/0043516 A1 | * | 2/2013 | Han | ................. H01L 21/76802 257/288 |

* cited by examiner

*Primary Examiner* — Caleen Sullivan
(74) *Attorney, Agent, or Firm* — Ding Yu Tan

(57) ABSTRACT

The method for cleaning a contact hole and forming a contact plug therein is provided. The method includes steps of: providing a silicon substrate; forming a contact hole in the silicon substrate; performing a pre-cleaning process to clean the contact hole; and forming a contact plug in the contact hole. The pre-cleaning process includes steps of: performing an oxide dry etching process; performing a first thermal annealing process with a temperature which is equal to or greater than 300° C.; performing a degassing process with a temperature which is equal to or greater than 300° C.; and performing an Ar-plasma etching process.

9 Claims, 3 Drawing Sheets

METHOD FOR CLEANING CONTACT HOLE AND FORMING CONTACT PLUG THEREIN

FIELD OF THE INVENTION

The present invention relates to a cleaning method, and more particularly to a method for cleaning a contact hole and forming a contact plug therein.

BACKGROUND OF THE INVENTION

For traditional semiconductor manufacturing processes, after forming a contact hole in the silicon substrate, the process further includes a step of performing a cleaning process to remove residues in the contact hole; and then forming a contact plug in the cleaned contact hole. However, due to the miniaturization of chip, a higher aspect ratio of the contact plug is required to reduce the resistance of a metal wire. Increasing the aspect ratio of the contact plug means that an opening of the contact hole becomes smaller or a depth of the contact hole becomes deeper. Using the traditional cleaning process to remove the residues in the contact hole having a deeper depth may cause incomplete cleaning issues and then reducing a reliability of components.

In view of the aforementioned reasons, there is a need to provide a new cleaning method to solve the aforementioned incomplete cleaning issues.

SUMMARY OF THE INVENTION

The present invention provides a method for cleaning a contact hole and forming a contact plug therein to effectively clean the contact hole and enhance a yield of a device.

In order to achieve the aforementioned advantages or other merits, a method for cleaning a contact hole and forming a contact plug therein is provided in an embodiment of the present invention. The method for cleaning a contact hole and forming a contact plug therein includes steps of: providing a silicon substrate; forming a contact hole in the silicon substrate; performing a pre-cleaning process to clean the contact hole; and forming a contact plug in the contact hole. The pre-cleaning process includes steps of: performing an oxide dry etching process; performing a first thermal annealing process with a temperature which is equal to or greater than 300° C.; performing a degassing process with a temperature which is equal to or greater than 300° C.; and performing an Ar-plasma etching process.

In summary, the pre-cleaning process to clean the contact hole, including steps of: performing the oxide dry etching process; performing the first thermal annealing process; performing the degassing process; and performing an Ar-plasma etching processing, is provided in the present invention to effectively clean the contact hole and effectively reduce the bubble issue and flake issue of the barrier metal layer.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
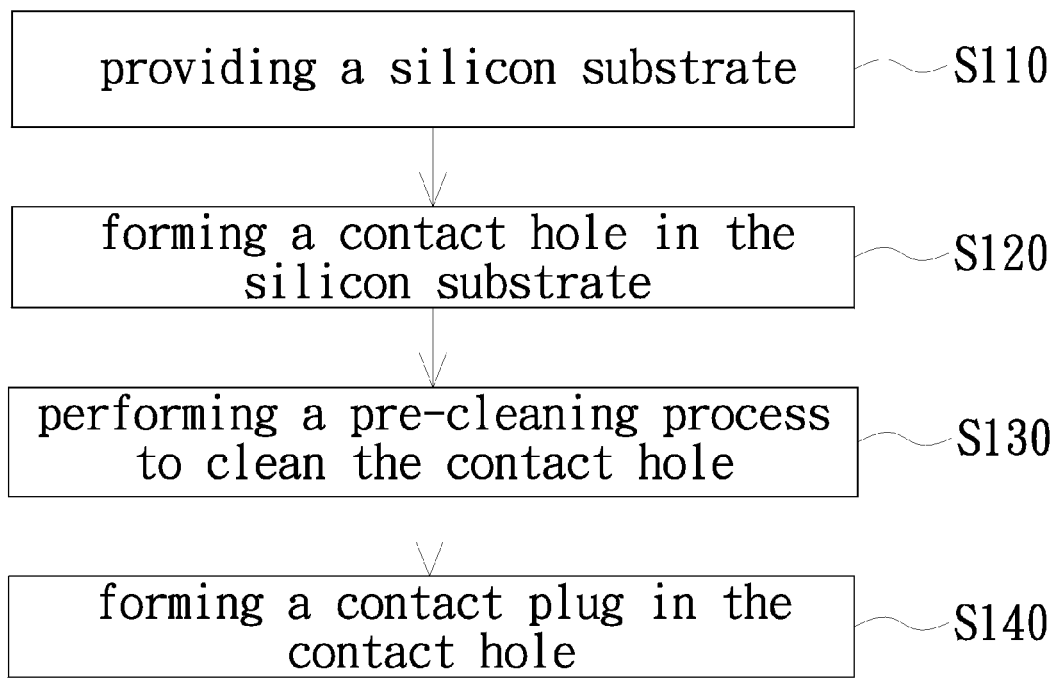
FIG. 1A is a flowchart of a method for cleaning a contact hole and forming a contact plug therein according to an embodiment of the present invention.

FIG. 1A is a flowchart of a method for cleaning a contact hole and forming a contact plug therein according to an embodiment of the present invention. Please refer to FIG. 1A. A method for cleaning a contact hole and forming a contact plug therein includes steps of: providing a silicon substrate (step S110); forming a contact hole in the silicon substrate (step S120); performing a pre-cleaning process to clean the contact hole (step S130); and forming a contact plug in the contact hole (step S140).

Figure 1B:
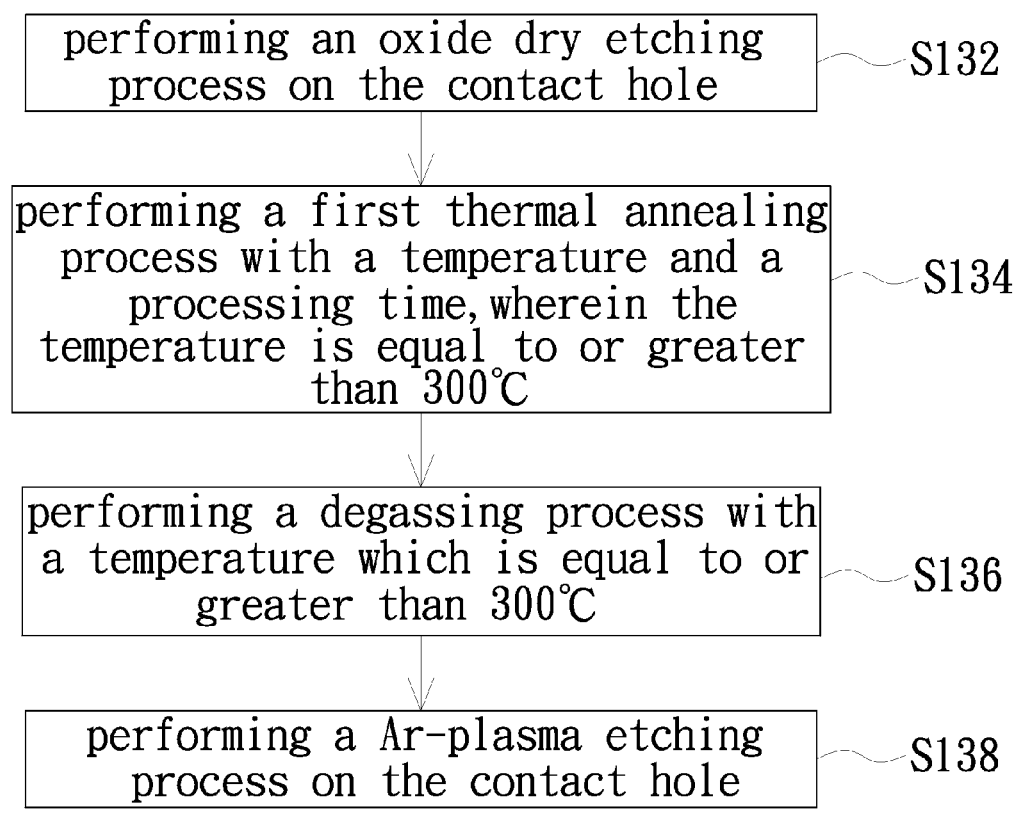
FIG. 1B is a flowchart of performing the pre-cleaning process to clean the contact hole according to the embodiment of the present invention.

Please refer to FIG. 1B. FIG. 1B is a flowchart of performing the pre-cleaning process to clean the contact hole according to the embodiment of the present invention. The pre-cleaning process performed to clean the contact hole (step S130 of FIG. 1A) includes steps of: performing an oxide dry etching process on the contact hole (step S132); performing a first thermal annealing process with a temperature and a processing time, wherein the temperature is equal to or greater than 300° C. (step S134); performing a degassing process with a temperature which is equal to or greater than 300° C. (step S136); and performing an Ar-plasma etching process on the contact hole (step S138).

The oxide dry etching process of step S132 of FIG. 1B is the SICONI™ etching process, available from Applied Materials, Inc., located in Santa Clara, Calif. The SICONI™ etching process includes an in-situ annealing step, wherein the in-situ annealing step is performed with a $H_2$ gas, and commonly performed with a temperature about 100° C. and with a short processing time. But if the contact hole with a higher aspect ratio has a deeper depth, by-products remaining in the contact hole cannot be effectively removed by the in-situ annealing step of the SICONI™ etching process in using such a low temperature and such a short processing time. So after completing the oxide dry etching process, the first thermal annealing process must be performed with a high enough temperature and with a long enough processing time to effectively remove by-products resulting in forming the contact hole in the silicon substrate. The first thermal annealing process of step S134 of FIG. 1B is performed without infusing any extra gas, and performed with the temperature, for example, ranges from 300° C.~500° C., and performed with the processing time, for example, ranges from 20~360 seconds. In other embodiment, the preferred processing time of the first thermal annealing process is 120 seconds.

In addition, it is to be noted that the oxide dry etching process and the first thermal anneal process are performed in the same chamber. However, due to a limitation of a processing sequence designed for general semiconductor machines, after completing the oxide dry etching process (the SICONI™ etching process) and the first thermal annealing process, the silicon substrate must be moved out of the chamber, and then moved into the chamber again to proceed to perform the Ar-plasma etching process. Since the silicon substrate was moved out of the chamber, water and gas will attach to the silicon substrate. So the degassing process as described in step S136 of FIG. 1B, serving as a pure thermal baking process performed without infusing any extra gas, must be performed on the silicon substrate to effectively remove water and gas after the silicon substrate being moved into the chamber again. And the degassing process is performed with the temperature, for example, ranging from 300° C.~500° C.

Figure 1C:
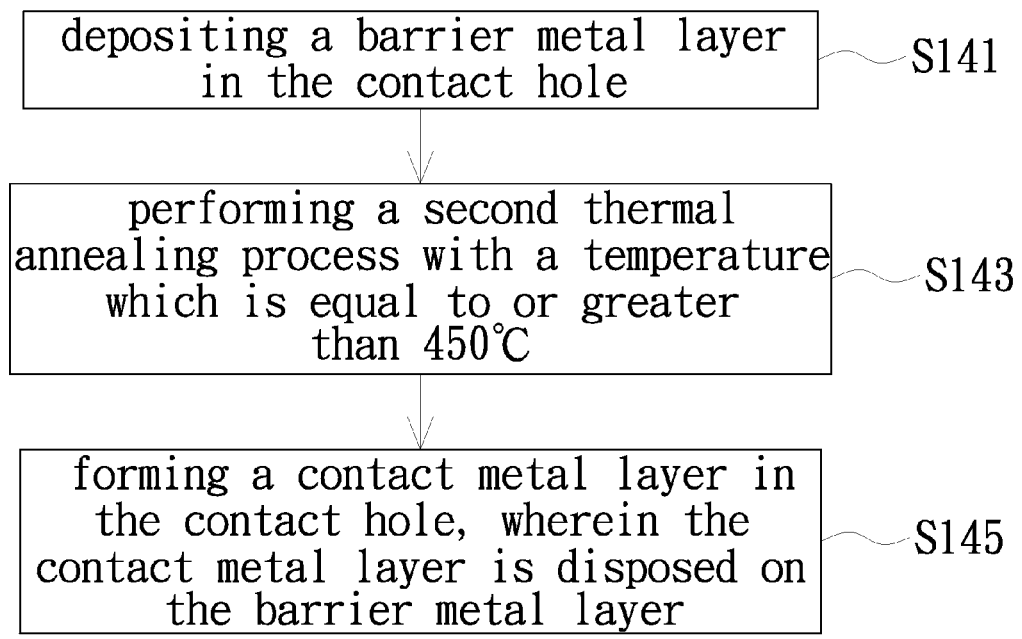
FIG. 1C is a flowchart of a method of forming the contact plug in the contact hole according to the embodiment of the present invention.

After completing the pre-cleaning process of the contact hole (step S130 of FIG. 1A), the step of forming the contact plug in the contact hole is performed. Please refer to FIG. 1C, which is a flowchart of a method of forming the contact plug in the contact hole according to the embodiment of the present invention. The illustrated method of forming the contact plug of FIG. 1C includes steps of: depositing a barrier metal layer in the contact hole (step S141); performing a second thermal annealing process with a temperature which is equal to or greater than 450° C. (step S143); and forming a contact metal layer in the contact hole, wherein the contact metal layer is disposed on the barrier metal layer (step S145).

The step of depositing the barrier metal layer in the contact hole includes stacking sequentially a Titanium (Ti) film and a Titanium Nitride (TiN) film in the contact hole. The contact metal layer has a material of tungsten, for instance. It is worth mentioning that after performing the second thermal annealing process on the silicon substrate and on the barrier metal layer, the Ti film in direct contacted with the silicon substrate is partially or fully transformed into a titanium silicide (TiSi) film. The TiSi film is configured to reduce a contact resistance of the contact metal layer, and the TiN film is configured to enhance an adhesion ability of the contact metal. So in order to transform the Ti film into the TiSi film, the second thermal annealing process is performed with a preferred temperature ranging from 450° C.~900° C. and a processing time ranging from 10~120 seconds, as well as performed by infusing $N_2$ gas into the running chamber.

In addition, after forming the contact metal layer in the contact hole, the method for cleaning a contact hole and forming a contact plug further includes, for example, a step of a Chemical-Mechanical Planarization (CMP) process.

In manufacturing process, after forming the contact hole in the silicon substrate, there are so many residues remained in the contact hole. If the residues are not completely removed, the remaining residues will cause a flake issue and a bubble issue of the barrier metal layer. In other words, if the residues are remained in the contact hole, after depositing the barrier metal layer in the contact hole and performing the second thermal anneal process on the barrier metal layer, due to the high temperature of the second thermal anneal process, the residues covered by the barrier metal layer will bulge and the barrier metal layer will have a lot of bubbles. If some bubbles are breaking up, the barrier metal layer will have not only a lot of bubbles, but also a lot of flakes. The bubbles and flakes will reduce a quality of the barrier metal layer and reduce a yield of a device. So the pre-cleaning process illustrated in FIG. 1B is provided according to the embodiment of the present invention to solve the bubble issue and the flake issue. And in fact, after completing the pre-cleaning process of the embodiment of the present invention, the bubble issue and the flake issue can be indeed reduced dramatically, and numbers of bubbles and flakes can be significantly decreased.

In summary, the pre-cleaning process to clean the contact hole, including steps of: performing the oxide dry etching process; performing the first thermal annealing process; performing the degassing process; and performing an Ar-plasma etching processing, is provided in the present invention to effectively clean the contact hole and effectively reduce the bubble issue and flake issue of the barrier metal layer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for cleaning a contact hole and forming a contact plug therein, the method comprising:
    providing a silicon substrate;
    forming a contact hole in the silicon substrate;
    performing a pre-cleaning process to clean the contact hole, the pre-cleaning process including:
    performing an oxide dry etching process;
    performing a first thermal annealing process with a temperature which is equal to or greater than 300° C.;
    performing a degassing process for removing water and gas with a temperature ranging from 300° C.~500° C.; and
    performing an Ar-plasma etching process; and
    forming a contact plug in the contact hole.

2. The method for cleaning the contact hole and forming the contact plug therein according to claim 1, wherein a method of forming the contact plug in the contact hole while performing the Ar-plasma etching process includes steps of:
    depositing a barrier metal layer in the contact hole;
    performing a second thermal annealing process with a temperature which is equal to or greater than 450° C.; and
    forming a contact metal layer in the contact hole, wherein the contact metal layer is disposed on the barrier metal layer.

3. The method for cleaning the contact hole and forming the contact plug therein according to claim 2, wherein the step of depositing the barrier metal layer in the contact hole includes:
    stacking sequentially a Titanium (Ti) film and a Titanium Nitride (TiN) film in the contact hole.

4. The method for cleaning the contact hole and forming the contact plug therein according to claim 3, wherein after performing the second thermal annealing process, the Ti film is partially transformed into a Titanium Silicide (TiSi) film.

5. The method for cleaning the contact hole and forming the contact plug therein according to claim 2, wherein the second thermal annealing process is performed with the temperature ranging from 450° C.~900° C. and with a processing time ranging from 10~120 seconds.

6. The method for cleaning the contact hole and forming the contact plug therein according to claim 2, wherein the second thermal annealing process is performed with N2 gas.

7. The method for cleaning the contact hole and forming the contact plug therein according to claim 1, wherein the first thermal annealing process is performed with the temperature ranging from 300° C.~500° C.

8. The method for cleaning the contact hole and forming the contact plug therein according to claim 7, wherein the first thermal annealing process is performed with a processing time ranging from 20~360 second.

9. The method for cleaning the contact hole and forming the contact plug therein according to claim 1, wherein the oxide dry etching process is the SICONI™ etching process.

* * * * *